(12) United States Patent
Song

(10) Patent No.: US 10,952,359 B2
(45) Date of Patent: Mar. 16, 2021

(54) SUBSTRATE PICK-AND-PLACE EQUIPMENT

(71) Applicants: HKC Corporation Limited, Shenzhen (CN); Chongqing HKC Optoelectronics Technology Co., Ltd., Chongqing (CN)

(72) Inventor: Li Song, Chongqing (CN)

(73) Assignees: HKC CORPORATION LIMITED, Shenzhen (CN); CHONGQING HKC OPTOELECTRONICS TECHNOLOGY CO., LTD, Chongqing (CN)

( * ) Notice: Subject to any disclaimer, the term of this patent is extended or adjusted under 35 U.S.C. 154(b) by 259 days.

(21) Appl. No.: 16/082,879

(22) PCT Filed: Jan. 22, 2018

(86) PCT No.: PCT/CN2018/073598
§ 371 (c)(1),
(2) Date: Sep. 6, 2018

(87) PCT Pub. No.: WO2019/134194
PCT Pub. Date: Jul. 11, 2019

(65) Prior Publication Data
US 2019/0215996 A1    Jul. 11, 2019

(30) Foreign Application Priority Data
Jan. 5, 2018    (CN) .......................... 2018 1 0011877

(51) Int. Cl.
*B23P 19/00*        (2006.01)
*H05K 13/04*        (2006.01)
(Continued)

(52) U.S. Cl.
CPC ....... *H05K 13/0409* (2018.08); *G02F 1/1303* (2013.01); *H05K 13/02* (2013.01); *H05K 13/0406* (2018.08); *Y10T 29/53191* (2015.01)

(58) Field of Classification Search
USPC ............ 29/743, 281.1, 407.1, 729, 739, 760
See application file for complete search history.

(56) References Cited

U.S. PATENT DOCUMENTS 8,039,739 B1 * 10/2011 Capps ................... H01L 31/048
                                                          136/259
8,296,937 B2 * 10/2012 Burke ..................... H01L 21/68
                                                           29/760

FOREIGN PATENT DOCUMENTS

CN        200992434 Y     12/2007
CN        202330960 U      7/2012
(Continued)

OTHER PUBLICATIONS

International Search Report and Written Opinion dated Oct. 15, 2018, in International Application No. PCT/CN2018/073598.

*Primary Examiner* — Thiem D Phan
(74) *Attorney, Agent, or Firm* — Muncy, Geissler, Olds & Lowe, P.C.

(57) ABSTRACT

This application relates to a substrate pick-and-place equipment and method. The equipment includes: a bearer platform, configured to bear a substrate; a retractable apparatus, including: a foldable bracket, disposed above the bearer platform and foldable along a horizontal direction; a plurality of suction structures, disposed on a bottom of the foldable bracket, where the suction structures are evenly distributed in a coverage area of the foldable bracket, and are configured to suck the substrate; a first drive unit, configured to drive the foldable bracket to extend and retract along the horizontal direction; and a second drive unit, configured to drive the retractable apparatus to rise and descend along a (Continued)

vertical direction; and a conveying apparatus, operating between the bearer platform and the foldable bracket. In the substrate pick-and-place method, a substrate is picked and placed from an upward side by using a suction structure.

10 Claims, 8 Drawing Sheets

(51) Int. Cl.
*H05K 13/02* (2006.01)
*G02F 1/13* (2006.01)

(56) References Cited

FOREIGN PATENT DOCUMENTS

| | | | |
|---|---|---|---|
| CN | 102874598 | A | 1/2013 |
| CN | 207726345 | U | 8/2018 |
| JP | 2009071117 | A | 4/2009 |

* cited by examiner

SUBSTRATE PICK-AND-PLACE EQUIPMENT

BACKGROUND

Technical Field

This application relates to a substrate pick-and-place equipment and method, and in particular, to a substrate pick-and-place equipment and method using a suction structure.

Related Art

In a manufacturing process of a liquid crystal panel, ultraviolet main curing (UVM) plays a key role in an alignment process of liquid crystals. The basic principle of the UVM is that: Ultraviolet exposure is performed on the liquid crystal panel after the liquid crystal panel is conveyed to a UVM machine table, and then the alignment process is completed.

However, at present, after a substrate of a liquid crystal panel is conveyed to a UVM machine table, in a phase of performing ultraviolet exposure on the substrate, a substrate pick-and-place equipment picks and places a sheet by using a mechanical arm in coordination with an operation of lift support levers.

1. During picking of the sheet, the lift support levers rise from a center and sides of a bearer platform of the substrate to lift the substrate, and the mechanical arm is inserted between the lift support levers to lift and pick the substrate.

2. During placing of the sheet, the substrate on the mechanical arm is placed on the lift support levers, and then the lift support levers descend, to place the substrate on the bearer platform.

Due to a small quantity of the lift support levers, support pressure to the substrate is very large, and may reach more than 100 N. Therefore, when the substrate of the liquid crystal panel bears such pressure, a pressure point causes an uneven image, and causes a product liquid crystal panel to be scrapped.

In addition, if the quantity of support levers is increased, a quantity of holes in the bearer platform is increased. Because the bearer platform of an alignment ultraviolet liquid crystal irradiation machine is a uniform temperature control platform, during manufacturing, a temperature of the liquid crystal substrate is required to be consistent. If the quantity of holes is increased, a temperature at a hole part is different from that at a solid part, causing a product anomaly. Moreover, the alignment ultraviolet liquid crystal irradiation machine performs ultraviolet irradiation on the substrate, and requires that uniformity of irradiance should be consistent. Different irradiance at the hole part and at the solid part causes a product anomaly.

Therefore, a specification and a size of a product need to be determined in advance before an equipment is designed and manufactured. A machine table is designed after a design of the product is finalized. Positions at which the lift support levers support the substrate cannot be in a display area of a display screen. After manufacturing of the equipment is finalized, a product the device can produce is also finalized. If a product of another size needs to be produced later, an equipment needs to be remanufactured, causing problems such as inflexibility of a product design and high manufacturing costs of an equipment.

SUMMARY

To resolve the foregoing technical problems, an objective of this application is to provide a substrate pick-and-place equipment and method, and in particular, a substrate pick-and-place equipment and method using a suction structure.

The objective of this application may further be achieved and the technical problem of this application may further be resolved by using the following technical measures.

This application provides a substrate pick-and-place equipment, comprising: a bearer platform, configured to bear a substrate; a retractable apparatus, comprising: a foldable bracket, wherein the foldable bracket is disposed above the bearer platform and is foldable along a horizontal direction, and the foldable bracket enters a coverage area of the substrate when extending to an unfolded state, and exits from the coverage area of the substrate when retracting to a folded state; a plurality of suction structures, disposed on a bottom of the foldable bracket, wherein the suction structures are evenly distributed in a coverage area of the foldable bracket in the unfolded state, and are configured to suck the substrate; a first drive unit, configured to drive the foldable bracket to extend and retract along the horizontal direction; and a second drive unit, configured to drive the retractable apparatus to rise and descend along a vertical direction; and a conveying apparatus, operating between the bearer platform and the foldable bracket, entering a coverage area of the bearer platform when extending, and exiting from the coverage area of the bearer platform when retracting.

In an embodiment of this application, the bearer platform is a closed, aperture-free planar structure.

In an embodiment of this application, the foldable bracket in the unfolded state is a mesh structure.

In an embodiment of this application, the suction structures are vacuum suction nozzles.

In an embodiment of this application, the first drive unit is a motor or a hydraulic cylinder.

In an embodiment of this application, the second drive unit is a motor or a hydraulic cylinder.

In an embodiment of this application, the conveying apparatus is a mechanical arm.

The objective of this application may further be achieved and the technical problem of this application may further be resolved by using the following technical measures.

This application provides a substrate pick-and-place method. Steps of the method comprise: operating a conveying apparatus to convey a substrate into a coverage area of a bearer platform; operating a first drive unit to make a foldable bracket extend and expand to a position above the substrate, wherein a plurality of suction structures is disposed on a bottom of the foldable bracket; operating a second drive unit to lower the foldable bracket, so that the suction structures on the bottom of the foldable bracket come into contact with and suck the substrate; operating the second drive unit to raise the foldable bracket and simultaneously raise the substrate sucked by the suction structures on the bottom of the foldable bracket; operating the conveying apparatus to extend out of the coverage area of the bearer platform; operating the second drive unit to lower the foldable bracket and simultaneously lower the substrate sucked by the suction structures on the bottom of the foldable bracket onto the bearer platform; operating the suction structures to stop sucking the substrate; operating the second drive unit to raise the foldable bracket; and operating the first drive unit to make the foldable bracket retract and exit from the position above the substrate.

In an embodiment of this application, after the operating the first drive unit to make the foldable bracket retract and exit from the position above the substrate, the substrate pick-and-place method further comprises the following steps: operating the first drive unit to make the foldable bracket extend and expand to the position above the substrate; operating the second drive unit to lower the foldable bracket, so that the suction structures on the bottom of the foldable bracket come into contact with and suck the substrate; operating the second drive unit to raise the foldable bracket and simultaneously raise the substrate sucked by the suction structures on the bottom of the foldable bracket; operating the conveying apparatus to extend into a position below the substrate; operating the second drive unit to lower the foldable bracket and simultaneously lower the substrate sucked by the suction structures on the bottom of the foldable bracket onto the conveying apparatus; operating the suction structures to stop sucking the substrate; operating the second drive unit to raise the foldable bracket; operating the first drive unit to make the foldable bracket retract and exit from the position above the substrate; and operating the conveying apparatus to convey the substrate to exit from the coverage area of the bearer platform.

After improved by this application, problems such as uneven ultraviolet irradiance and uneven temperature caused due to holes dug in the bearer platform can be avoided by using the suction structure to pick and place the substrate, and a product yield rate is improved. Moreover, a product can be flexibly designed without considering the holes in the bearer platform, and costs of designing a product and manufacturing an equipment can be saved.

DETAILED DESCRIPTION

Figure 1A:
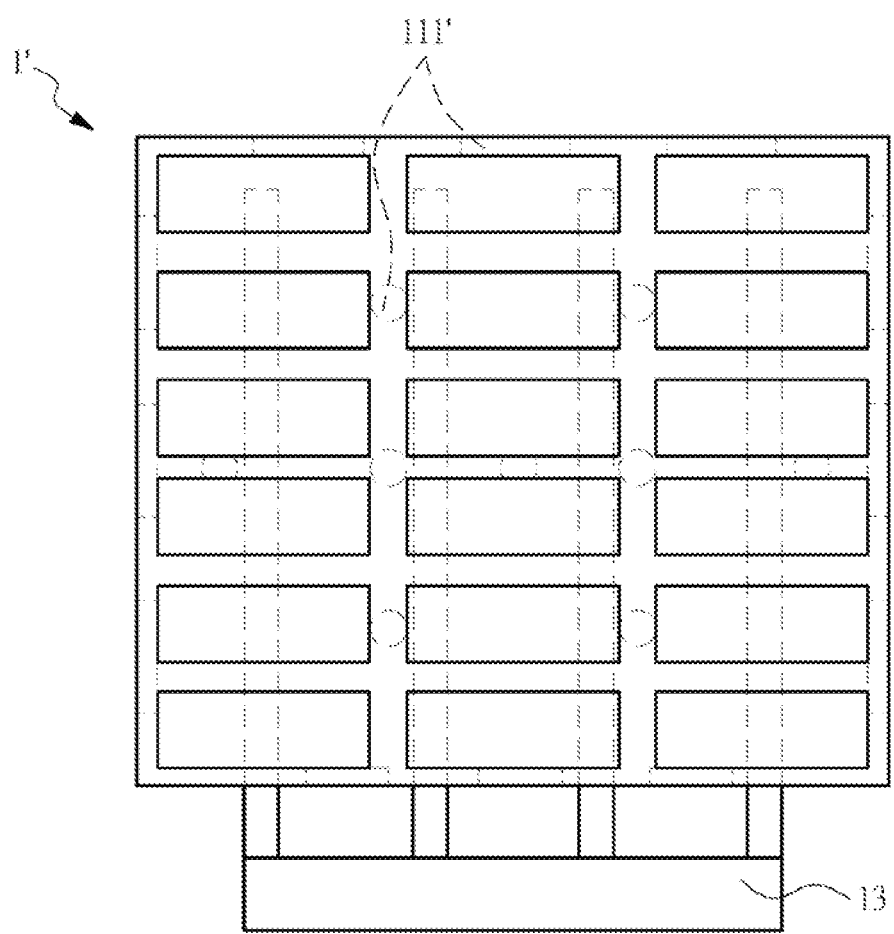
FIG. 1A is a schematic top view of picking and placing a sheet by exemplarily using a mechanical arm.

The following embodiments are described with reference to the accompanying drawings, used to exemplify specific embodiments for implementation of this application. Direction terms mentioned in this application, such as "on", "below", "front", "back", "left", "right", "in", "out", and "side" merely refer to directions in the accompanying drawings. Therefore, the direction terms used herein are for the purpose of describing and understanding this application, and are not intended to limit this application.

The accompanying drawings and the description are considered to be essentially exemplary, rather than limitative. In the figures, modules with similar structures are represented by using a same reference numeral. In addition, for understanding and ease of description, the size and the thickness of each component shown in the accompanying drawings are arbitrarily shown, but this application is not limited thereto.

In the accompanying drawings, for clarity, the thicknesses of a layer, a film, a panel, an area, and the like are exaggerated. In the accompanying drawings, for understanding and ease of description, the thicknesses of some layers and areas are exaggerated. It should be understood that when a component such as a layer, a film, an area, or a base is described to be "on" another component, the component may be directly on the another component, or there may be an intermediate component.

In addition, in this specification, unless otherwise explicitly described, the word "include" is understood as including the component, but not excluding any other component. In addition, in this specification, "on" means that a component is located above or below a target component, but does not mean that the component needs to be located on the top based on the direction of gravity.

To further describe the technical means used in this application to achieve the application objective and effects thereof, specific implementations, structures, features, and effects of a substrate pick-and-place equipment and method provided according to this application are described in detail below with reference to the accompanying drawings and preferred embodiments.

Figure 1B:
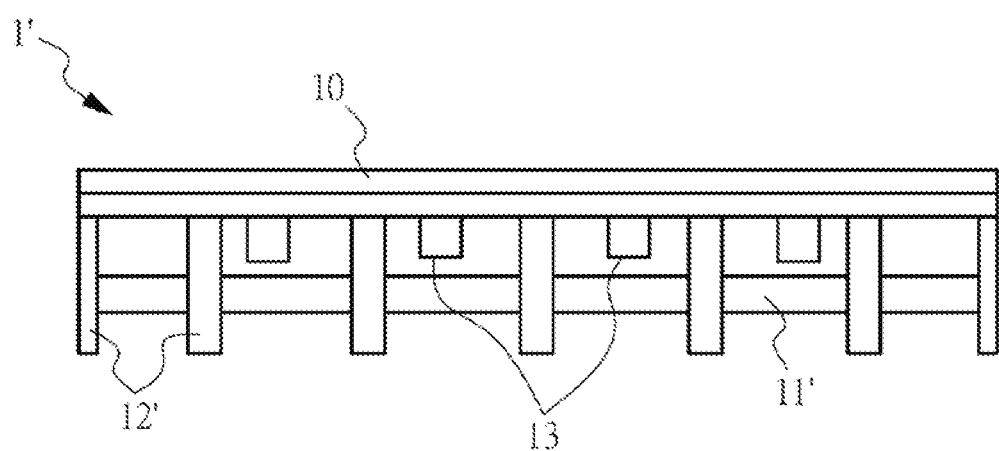
FIG. 1B is a schematic front view of picking and placing a sheet by exemplarily using a mechanical arm.

First, referring to FIG. 1A and FIG. 1B, FIG. 1A and FIG. 1B are respectively a schematic top view and a front view of picking and placing a sheet by exemplarily using a mechanical arm. As shown in the figure, a problem to be resolved in this application is that at present, in ultraviolet main curing (UVM), after a substrate 10 of a liquid crystal panel is conveyed to a UVM machine table, in a phase of performing ultraviolet exposure on the substrate 10, a substrate pick-and-place equipment 1' picks and places a sheet by using a mechanical arm 13 in coordination with an operation of lift support levers 12'.

1. During picking of the sheet, the lift support levers 12' rise and pass through holes 111' in a center and sides of a bearer platform 11' of the substrate to lift the substrate, and the mechanical arm 13 is inserted between the lift support levers 12', to lift and pick the substrate 10.

2. During placing of the sheet, the substrate 10 on the mechanical arm 13 is placed on the lift support levers 12', and then the lift support levers 12' descend, to place the substrate 10 on the bearer platform 11'.

Due to a small quantity of the lift support levers 12', support pressure to the substrate 10 is very large, and may reach more than 100 N. Therefore, when the substrate 10 of the liquid crystal panel bears such pressure, a pressure point causes an uneven image, and causes a product liquid crystal panel to be scrapped.

In addition, if the quantity of lift support levers 12' is increased, a quantity of holes 111' in the bearer platform 11' needs to be correspondingly increased. Because the bearer platform 11' of an alignment ultraviolet liquid crystal irradiation machine is a uniform temperature control platform, during manufacturing, a temperature of the liquid crystal substrate 10 is required to be consistent. If the quantity of holes 111' is increased, a temperature at a hole part 111' is different from that at a solid part, easily causing a product anomaly. Moreover, when the alignment ultraviolet liquid crystal irradiation machine performs ultraviolet irradiation on the substrate 10, uniformity of irradiance is required to be consistent. Different irradiance at the hole part 111' and at the solid part also causes a product anomaly.

Refer to FIG. 2A to FIG. 3B for structures related to this application. The objective of this application and the technical problem to be resolved in this application include a substrate pick-and-place equipment 1, including: a bearer platform 11, configured to bear a substrate 10; a retractable apparatus 12, including: a foldable bracket 121, where the foldable bracket 121 is disposed above the bearer platform 11 and is foldable along a horizontal direction, and the foldable bracket 121 enters a coverage area of the substrate 10 when extending to an unfolded state 121A, and exits from the coverage area of the substrate 10 when retracting to a folded state 121B; a plurality of suction structures, disposed on a bottom of the foldable bracket 121, where the suction structures are evenly distributed in a coverage area of the foldable bracket 121 in the unfolded state 121A, and are configured to suck the substrate 10; a first drive unit 123, configured to drive the foldable bracket 121 to extend and retract along the horizontal direction; and a second drive unit 124, configured to drive the retractable apparatus 12 to rise and descend along a vertical direction; and a conveying apparatus, operating between the bearer platform 11 and the foldable bracket 121, entering a coverage area of the bearer platform 11 when extending, and exiting from the coverage area of the bearer platform 11 when retracting.

In this embodiment, the conveying apparatus is a mechanical arm 13.

In this embodiment, the bearer platform 11 is a closed, aperture-free planar structure. The bearer platform 11 of an alignment ultraviolet liquid crystal irradiation machine is made into a closed, aperture-free complete planar structure. Therefore, problems such as uneven ultraviolet irradiance and uneven temperature can be avoided, so that the substrate 10 receives more even ultraviolet liquid crystal irradiation, and a better irradiation effect is achieved.

Figure 2A:
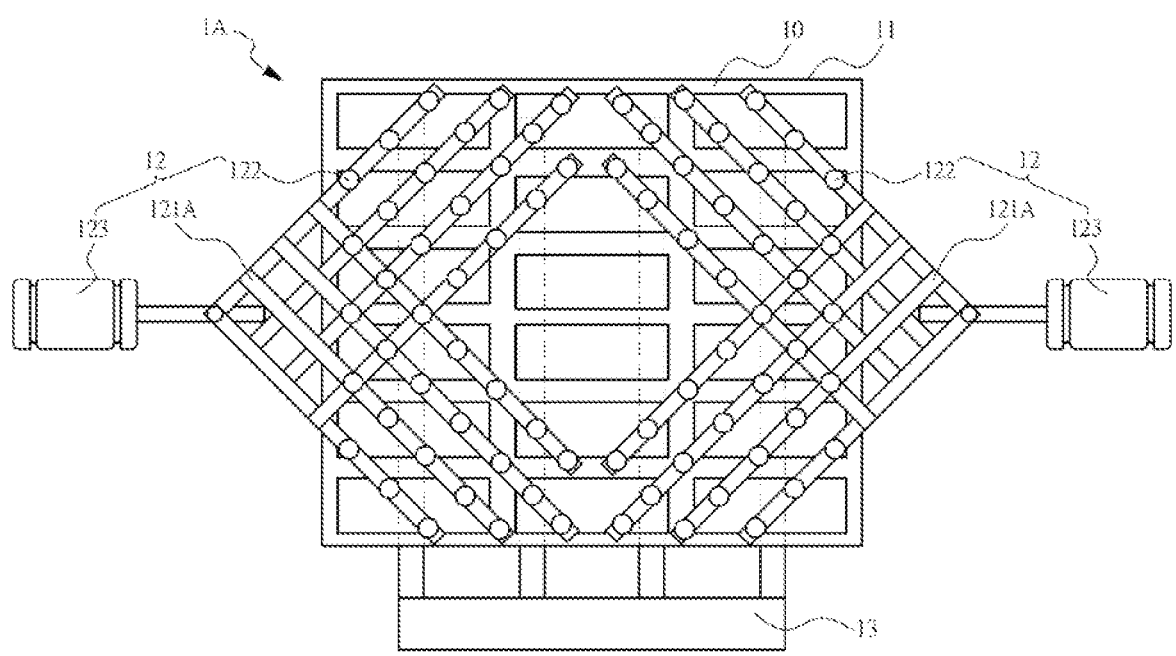
FIG. 2A is a schematic diagram of an expanded state of a retractable apparatus according to an embodiment of this application.
Figure 2B:
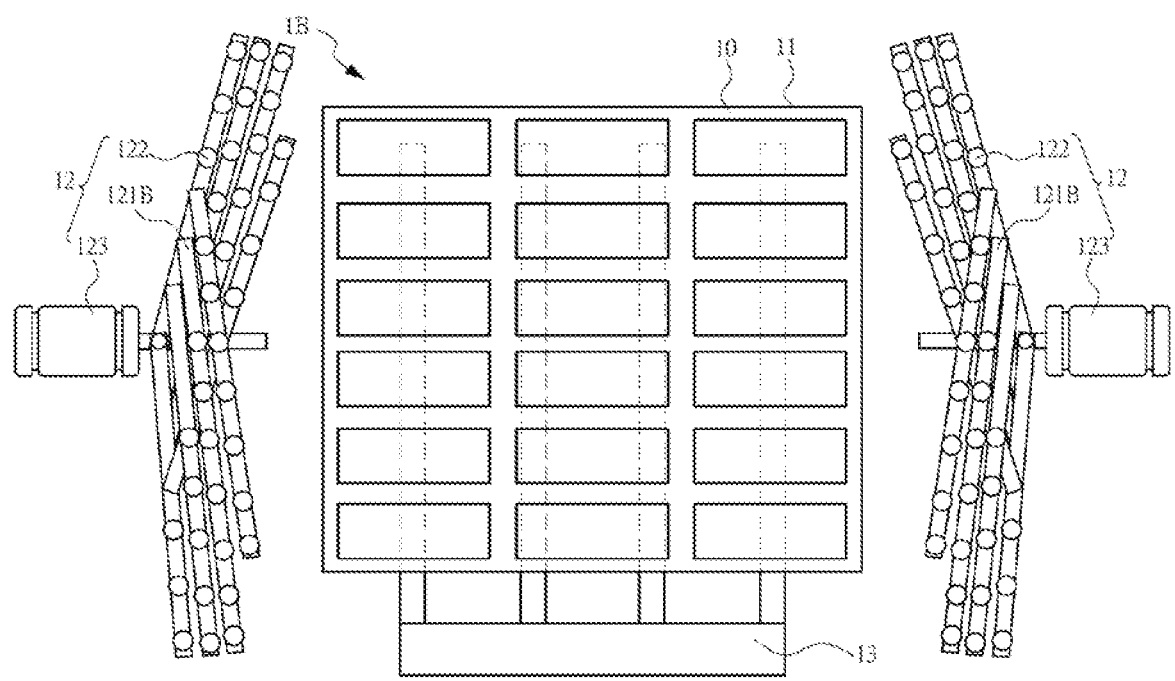
FIG. 2B is a schematic diagram of a retracted state of a retractable apparatus according to an embodiment of this application.

Referring to FIG. 2A and FIG. 2B, as shown in an expanding substrate pick-and-place equipment 1A in FIG. 2A and a substrate pick-and-place device 1B in FIG. 2B, the foldable bracket 121 is a mesh structure when in the unfolded state 121A (shown in FIG. 2A), and retracts to an area other than the substrate 10 when in the folded state 121B (shown in FIG. 2B). The foldable bracket 121 is driven by using the first drive unit 123 to retract to the folded state 121B when the substrate 10 is irradiated, and to extend to the unfolded state 121A when the substrate is picked and placed, avoiding blocking rays of a lamp above the substrate 10 and affecting ultraviolet irradiation uniformity.

In this embodiment, the suction structures are vacuum suction nozzles 122.

Figure 3A:
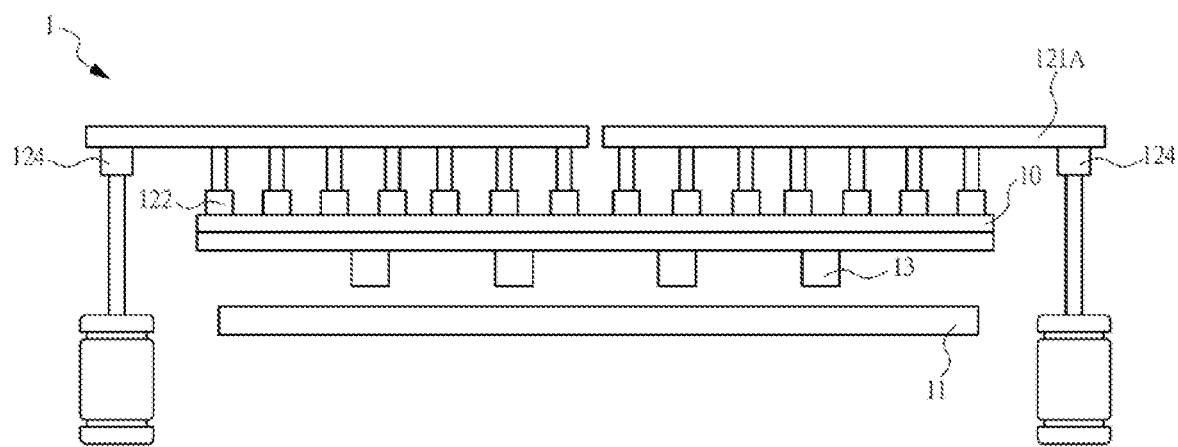
FIG. 3A is a schematic diagram of sheet picking of a sheet pick-and-place method in a suction manner according to an embodiment of this application.
Figure 3B:
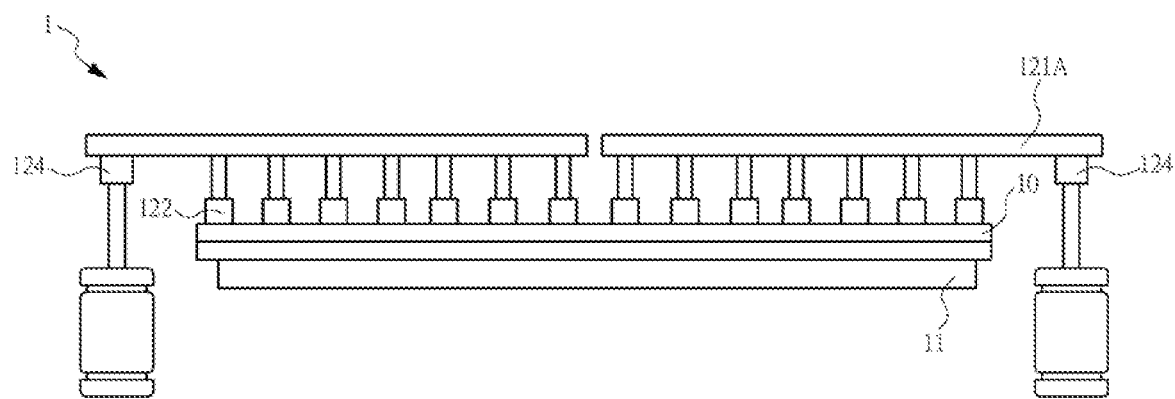
FIG. 3B is a schematic diagram of sheet placing of a sheet pick-and-place method in a suction manner according to an embodiment of this application.

Referring to FIG. 3A and FIG. 3B, in a substrate pick-and-place method, the substrate 10 is sucked and lifted from an upward side by using the vacuum suction nozzles 122, to enable the mechanical 13 to pick and place the substrate 10. In an actual operation, the substrate pick-and-place equipment sucks the substrate 10 by using the vacuum suction nozzles 122, and drives the retractable apparatus 12 to rise and descend by using the second drive unit 124, to lift (shown in FIG. 3A) or place (shown in FIG. 3B) the substrate 10. The vacuum suction nozzles 122 are evenly distributed in the coverage area of the foldable bracket 121 in the unfolded state 121A. For example, in this embodiment, a total of 76 suction points of the vacuum suction nozzles 122 are designed, to reduce suction force at each suction point, avoiding problems such as bending of the substrate 10 and excessive force born by the substrate 10.

In this embodiment, the first drive unit 123 is a motor or a hydraulic cylinder.

In this embodiment, the second drive unit 124 is a motor or a hydraulic cylinder.

Figure 4A:
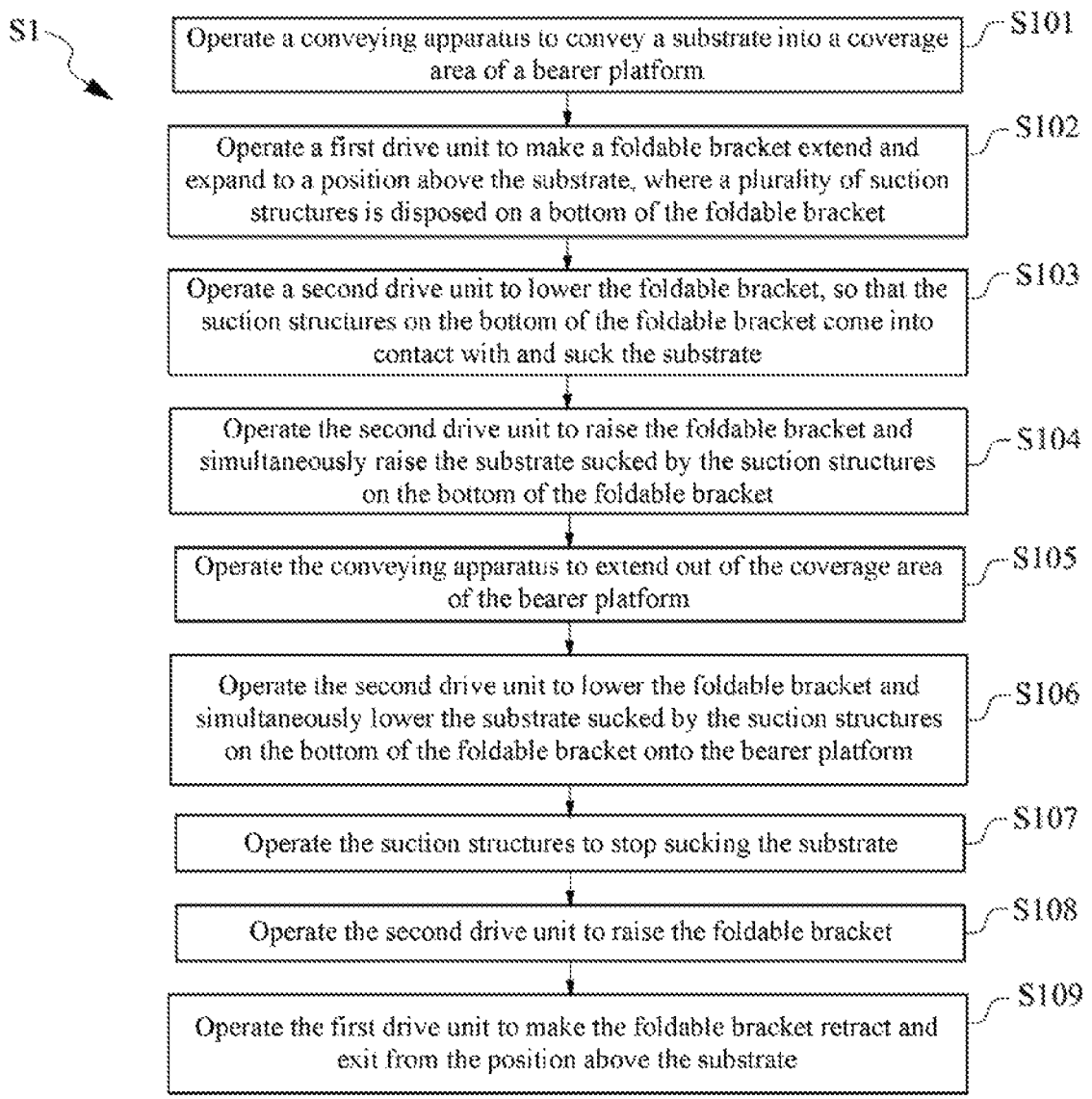
FIG. 4A is a flowchart of a substrate pick-and-place method according to an embodiment of this application.

Further, referring to FIG. 4A, the objective of this application and the technical problem to be resolved in this application further include a substrate pick-and-place method S1. Steps of the method include the following steps.

Step S101: Operate a conveying apparatus to convey a substrate into a coverage area of a bearer platform.

Step S102: Operate a first drive unit to make a foldable bracket extend and expand to a position above the substrate, where a plurality of suction structures is disposed on a bottom of the foldable bracket.

Step S103: Operate a second drive unit to lower the foldable bracket, so that the suction structures on the bottom of the foldable bracket come into contact with and suck the substrate.

Step S104: Operate the second drive unit to raise the foldable bracket and simultaneously raise the substrate sucked by the suction structures on the bottom of the foldable bracket.

Step S105: Operate the conveying apparatus to extend out of the coverage area of the bearer platform.

Step S106: Operate the second drive unit to lower the foldable bracket and simultaneously lower the substrate sucked by the suction structures on the bottom of the foldable bracket onto the bearer platform.

Step S107: Operate the suction structures to stop sucking the substrate.

Step S108: Operate the second drive unit to raise the foldable bracket.

Step S109: Operate the first drive unit to make the foldable bracket retract and exit from the position above the substrate.

Figure 4B:
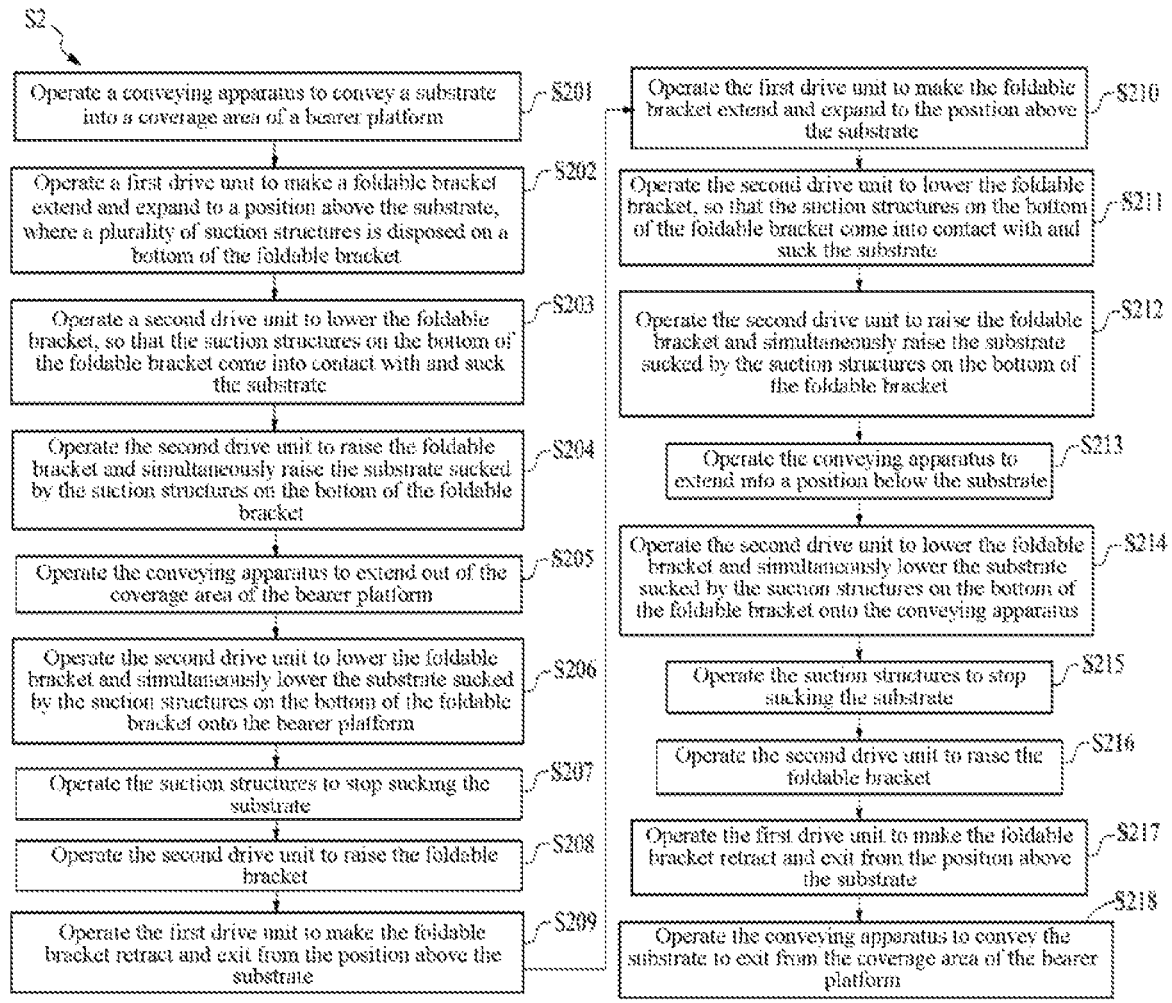
FIG. 4B is a flowchart of a substrate pick-and-place method according to another embodiment of this application.

At last, referring to FIG. 4B, the objective of this application and the technical problem to be resolved in this application further include a substrate pick-and-place method S2. Steps of the method include the following steps.

Step S201: Operate a conveying apparatus to convey a substrate into a coverage area of a bearer platform.

Step S202: Operate a first drive unit to make a foldable bracket extend and expand to a position above the substrate, where a plurality of suction structures is disposed on a bottom of the foldable bracket.

Step S203: Operate a second drive unit to lower the foldable bracket, so that the suction structures on the bottom of the foldable bracket come into contact with and suck the substrate.

Step S204: Operate the second drive unit to raise the foldable bracket and simultaneously raise the substrate sucked by the suction structures on the bottom of the foldable bracket.

Step S205: Operate the conveying apparatus to extend out of the coverage area of the bearer platform.

Step S206: Operate the second drive unit to lower the foldable bracket and simultaneously lower the substrate sucked by the suction structures on the bottom of the foldable bracket onto the bearer platform.

Step S207: Operate the suction structures to stop sucking the substrate.

Step S208: Operate the second drive unit to raise the foldable bracket.

Step S209: Operate the first drive unit to make the foldable bracket retract and exit from the position above the substrate.

Step S210: Operate the first drive unit to make the foldable bracket extend and expand to the position above the substrate.

Step S211: Operate the second drive unit to lower the foldable bracket, so that the suction structures on the bottom of the foldable bracket come into contact with and suck the substrate.

Step S212: Operate the second drive unit to raise the foldable bracket and simultaneously raise the substrate sucked by the suction structures on the bottom of the foldable bracket.

Step S213: Operate the conveying apparatus to extend into a position below the substrate.

Step S214: Operate the second drive unit to lower the foldable bracket and simultaneously lower the substrate sucked by the suction structures on the bottom of the foldable bracket onto the conveying apparatus.

Step S215: Operate the suction structures to stop sucking the substrate.

Step S216: Operate the second drive unit to raise the foldable bracket.

Step S217: Operate the first drive unit to make the foldable bracket retract and exit from the position above the substrate.

Step S218: Operate the conveying apparatus to convey the substrate to exit from the coverage area of the bearer platform.

Phrases such as "in some embodiments" and "in various embodiments" are repeatedly used. The phrases usually refer to different embodiments, but they may also refer to a same embodiment. Terms, such as "comprise", "have", and "include", are synonyms, unless otherwise described in context.

Descriptions above are merely preferred embodiments of this application, and are not intended to limit this application. Although this application has been disclosed above in forms of preferred embodiments, the embodiments are not intended to limit this application. A person skilled in the art can make some equivalent variations, alterations or modifications to the above disclosed technical content without departing from the scope of the technical solutions of the above disclosed technical content to obtain equivalent embodiments. Any simple alteration, equivalent change or modification made to the foregoing embodiments according to the technical essence of this application without departing from the content of the technical solutions of this application shall fall within the scope of the technical solutions of this application.

What is claimed is:

1. A substrate pick-and-place equipment, comprising:
   a bearer platform, configured to bear a substrate;
   a retractable apparatus, comprising:
   a foldable bracket, disposed above the bearer platform and foldable along a horizontal direction, wherein the foldable bracket enters a coverage area of the substrate when extending to an unfolded state, and exits from the coverage area of the substrate when retracting to a folded state;
   a plurality of suction structures, disposed on a bottom of the foldable bracket, wherein the suction structures are evenly distributed in a coverage area of the foldable bracket in the unfolded state, and are configured to suck the substrate;
   a first drive unit, configured to drive the foldable bracket to extend and retract along the horizontal direction; and
   a second drive unit, configured to drive the retractable apparatus to rise and descend along a vertical direction; and
   a conveying apparatus, operating between the bearer platform and the foldable bracket, entering a coverage area of the bearer platform when extending, and exiting from the coverage area of the bearer platform when retracting.

2. The substrate pick-and-place equipment according to claim 1, wherein the bearer platform is a closed, aperture-free planar structure.

3. The substrate pick-and-place equipment according to claim 1, wherein the foldable bracket in the unfolded state is a mesh structure.

4. The substrate pick-and-place equipment according to claim 1, wherein the suction structures are vacuum suction nozzles.

5. The substrate pick-and-place equipment according to claim 1, wherein the first drive unit is a motor.

6. The substrate pick-and-place equipment according to claim 1, wherein the first drive unit is a hydraulic cylinder.

7. The substrate pick-and-place equipment according to claim 1, wherein the second drive unit is a motor.

8. The substrate pick-and-place equipment according to claim 1, wherein the second drive unit is a hydraulic cylinder.

9. The substrate pick-and-place equipment according to claim 1, wherein the conveying apparatus is a mechanical arm.

10. A substrate pick-and-place equipment, comprising:
    a closed, aperture-free bearer platform, configured to bear a substrate;
    a retractable apparatus, comprising:
    a foldable bracket, disposed above the bearer platform and foldable along a horizontal direction, wherein the foldable bracket enters a coverage area of the substrate when extending to an unfolded state, and exits from the coverage area of the substrate when retracting to a folded state;
    a plurality of vacuum suction nozzles, disposed on a bottom of the foldable bracket, wherein the vacuum suction nozzles are evenly distributed in a coverage area of the foldable bracket in the unfolded state, and are configured to suck the substrate;
    a first drive unit, configured to drive the foldable bracket to extend and retract along the horizontal direction; and
    a second drive unit, configured to drive the retractable apparatus to rise and descend along a vertical direction; and
    a mechanical arm, operating between the bearer platform and the foldable bracket, entering the coverage area of the substrate when extending, and exiting from the coverage area of the substrate when retracting.

* * * * *